United States Patent [19]
Ong

[11] Patent Number: 5,970,020
[45] Date of Patent: Oct. 19, 1999

[54] CONTROLLING THE SET UP OF A MEMORY ADDRESS

[75] Inventor: Adrian E. Ong, Pleasanton, Calif.

[73] Assignee: G-Link Technology, Santa Clara, Calif.

[21] Appl. No.: 09/154,664

[22] Filed: Sep. 16, 1998

[51] Int. Cl.$^6$ .................................................... G11C 8/00
[52] U.S. Cl. ...................... 365/230.08; 365/233; 365/193
[58] Field of Search .............................. 365/230.08, 233, 365/193

[56] References Cited

U.S. PATENT DOCUMENTS 5,691,953  11/1997  Yeh et al. ........................... 365/230.08

Primary Examiner—Andrew Q. Tran
Attorney, Agent, or Firm—Shjerven, Morrill, MacPherson, Franklin & Friel, LLP; Alan H. MacPherson; Philip W. Woo

[57] ABSTRACT

A circuit is provided for controlling the set up of a memory address. The circuit includes a first latch circuit for latching a first memory address in response to a first simultaneous occurrence of a predetermined value for an output enable signal and a predetermined value for a row address strobe signal. A second latch circuit is coupled to the first latch circuit. The second latch circuit receives the first memory address from the first latch circuit and latches the first row address thereafter for decoding. The first latch circuit can latch a second memory address in response to a second simultaneous occurrence of the predetermined value for the output enable signal and the predetermined value for the row address strobe signal, the second simultaneous occurrence occurring while the first row address is being decoded.

10 Claims, 3 Drawing Sheets

CONTROLLING THE SET UP OF A MEMORY ADDRESS

FIELD OF THE INVENTION

The present invention relates generally to the field of semiconductor integrated circuits, and more particularly, to controlling the set up of a memory address.

BACKGROUND OF THE INVENTION

Integrated circuit (IC) memory devices allow large amounts of data to be stored in relatively small physical packages. A typical IC memory device comprises a plurality of memory cells. Separate bits of data may written into, stored, and read out of each of these memory cells. Memory cells can be organized in rows, each of which may be identified by a respective address. A respective row line or "word line" provides access to each row of memory cells. For this access, each word line is "enabled" by latching and decoding the address for the respective row.

According to a previously developed technique, a row address strobe (RAS) signal is exclusively used to set up each row address so that such address can be latched for decoding. With such prior technique, a new row address cannot be set up until a previous row address has been completely decoded. This limits the speed at which an IC memory device can be operated. An ongoing challenge for IC devices in general, however, is to increase performance by providing more rapid operation. Thus, it is desirable that the addressing of a row be made more rapid.

SUMMARY

The disadvantages and problems associated with previously developed techniques for setting up a row address have been substantially reduced or eliminated using the present invention.

In accordance with one embodiment of the present invention, a circuit is provided for controlling the set up of a memory address. The circuit includes a first latch circuit for latching a first memory address in response to a first simultaneous occurrence of a predetermined value for an output enable signal and a predetermined value for a row address strobe signal. A second latch circuit is coupled to the first latch circuit. The second latch circuit receives the first memory address from the first latch circuit and latches the first row address thereafter for decoding. The first latch circuit can latch a second memory address in response to a second simultaneous occurrence of the predetermined value for the output enable signal and the predetermined value for the row address strobe signal, the second simultaneous occurrence occurring while the first row address is being decoded.

In accordance with another embodiment of the present invention, a method is provided for controlling the set up of a memory address. The method includes the following: latching a first memory address in response to a first simultaneous occurrence of a predetermined value for an output enable signal and a predetermined value for a row address strobe signal; decoding the first memory address for access to at least one memory cell corresponding to the first memory address; and while the first memory address is being decoded, latching a second memory address in response to a second simultaneous occurrence of the predetermined value for the output enable signal and the predetermined value for the row address strobe signal.

An important technical advantage of the present invention includes providing more rapid operation of an IC memory device by controlling the set up of a memory address with both the row address strobe signal (RAS) and the output enable signal ($\overline{OE}$). This is accomplished by incorporating two latch circuits into the IC memory device. The first latch circuit stores or latches a first memory address upon the simultaneous occurrence of predetermined value for the $\overline{OE}$ signal and a predetermined value for the RAS signal. The first memory address is then latched into the second latch circuit, where such address can be decoded for access into the respective memory cells. Upon the next simultaneous occurrence of the predetermined values for the $\overline{OE}$ and RAS signals—which can take place while the first memory address is still being decoded—a second memory address is latched into the first latch circuit. Because the second memory address can be received and set up even as the first memory address is being decoded, the present invention accelerates the operation of the IC memory device, thereby enhancing the device's performance.

Other important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE PREFERRED EMBODIMENTS

The preferred embodiments of the present invention and their advantages are best understood by referring to FIGS. 1 through 4 of the drawings. In these drawings, like numerals are used for like and corresponding parts.

Figure 1:
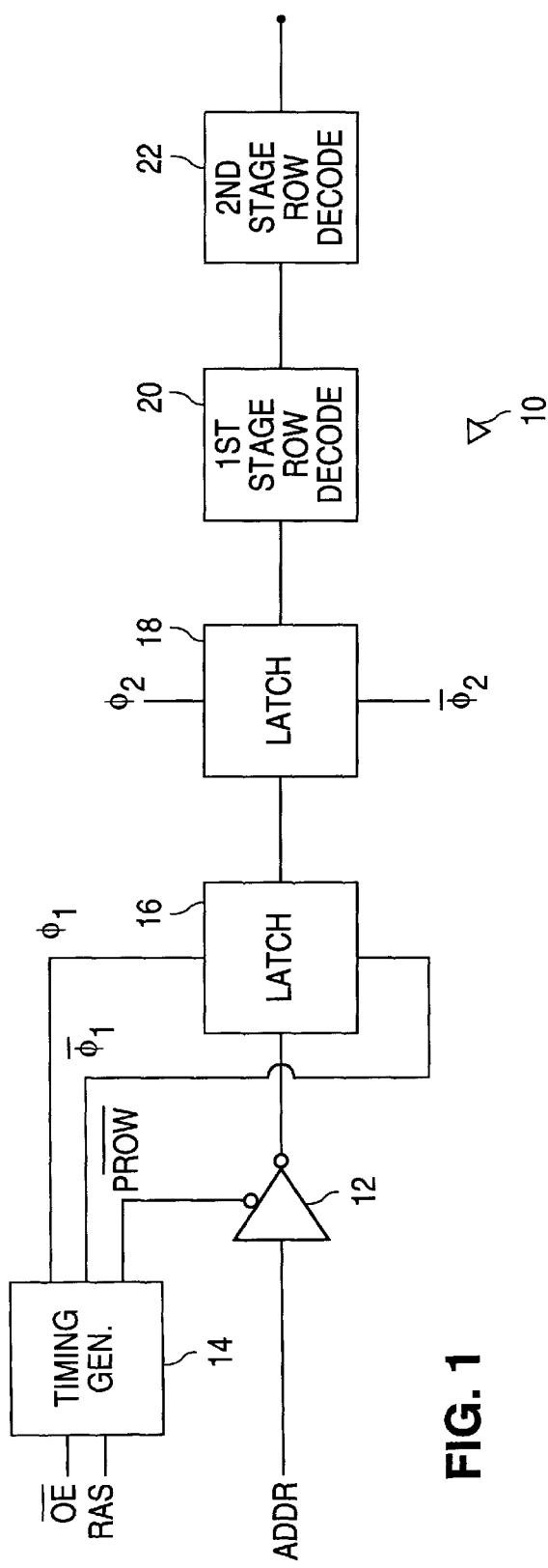
FIG. 1 is an exemplary block diagram of a circuit for controlling the set up of a memory address, in accordance with an embodiment of the present invention.

FIG. 1 is an exemplary block diagram of a circuit 10 for controlling the set up of a memory address, in accordance with an embodiment of the present invention. Circuit 10 can be incorporated into any suitable integrated circuit (IC) memory device for enhancing performance thereof. For example, in one embodiment, such memory device may be a dynamic random access memory (DRAM) in which data stored therein decays over time; accordingly, numerous refresh operations are required to maintain the integrity of the stored data. Such DRAM can be asynchronous.

Circuit 10 receives an address (ADDR) signal, which conveys information relating to one or more memory addresses for rows—or alternatively, columns—of memory cells to be accessed. In general, as used herein, "memory address" can be either a row address or a column address. Although the following describes the invention primarily with regard to row addresses, it should be understood that the invention may be equally applicable to column addresses.

A buffer 12 buffers and inverts the ADDR signal. Buffer 12 is enabled by a power-up row address ($\overline{\text{PROW}}$) signal, which is generated by a timing generator circuit 14 coupled to the buffer. As used herein, the terms "coupled," "connected," or any variant thereof, means any coupling or connection, either direct or indirect, between two or more elements.

Timing generator circuit 14 operates on an output enable ($\overline{\text{OE}}$) signal and a row address strobe (RAS) signal to generate timing signals $\Phi1$ and $\overline{\Phi1}$, as well as the $\overline{\text{PROW}}$ signal. In general, the value (high or low) for each of the $\Phi1$, $\overline{\Phi1}$, and $\overline{\text{PROW}}$ timing signals may depend on the values of the $\overline{\text{OE}}$ and RAS (or a row address strobe complement ($\overline{\text{RAS}}$)) signals. In one embodiment, the $\overline{\text{PROW}}$, $\Phi1$ and $\overline{\Phi1}$ signals may each comprise pulse signals which are generated in response to the simultaneous occurrence of a predetermined value for the $\overline{\text{OE}}$ signal and a predetermined value for the RAS signal. For example, as described herein, the simultaneous occurrence of a high value for the $\overline{\text{RAS}}$ signal and a low value for the $\overline{\text{OE}}$ signal causes a pulse in the $\Phi1$ signal. Specifically, such pulse in the $\Phi1$ signal may be generated when the value of the $\overline{\text{RAS}}$ signal is high as the value of the $\overline{\text{OE}}$ signal goes low, or alternatively, when the value of the $\overline{\text{OE}}$ signal is low as the value of the $\overline{\text{RAS}}$ signal goes high. An exemplary derivation of the $\Phi1$, $\overline{\Phi1}$, and $\overline{\text{PROW}}$ timing signals from the $\overline{\text{OE}}$ and RAS (or $\overline{\text{RAS}}$) signals is described below in more detail.

A first latch circuit 16 and a second latch circuit 18 are coupled in series to the output lead of buffer 12. First latch circuit 16 receives, and responds to, the $\Phi1$ and $\overline{\Phi1}$ signals. First latch circuit 16 passes and latches a memory address (conveyed by the ADDR signal) upon the occurrence of a pulse in the $\Phi1$ signal. In one embodiment, as described herein, for the duration of a pulse in the $\Phi1$ signal, first latch circuit 16 passes a memory address; at the end of such pulse in the $\Phi1$ signal, first latch circuit 16 latches the memory address.

An input lead of second latch circuit 18 is connected to the output lead of first latch circuit 16 so that second latch circuit 18 may receive memory addresses therefrom. Second latch circuit 18 receives a $\Phi2$ signal and its complement, $\overline{\Phi2}$. In one embodiment, the $\Phi2$ and $\overline{\Phi2}$ signals may comprise a number of pulse signals. Second latch circuit 18 passes and latches a memory address upon the occurrence of a pulse in the $\Phi2$ signal. For example, in one embodiment, for the duration of a pulse in the $\Phi2$ signal, second latch circuit 18 passes a memory address; at the end of such pulse in the $\Phi2$ signal, second latch circuit 18 latches the memory address. When passed by and/or latched in second latch circuit 18, a memory address can be decoded for access into the corresponding memory cells.

A first stage row decode circuit 20 and a second stage row decode circuit 22 are coupled in series to the output lead of second latch circuit 18. First and second stage row decode circuits 20 and 22 decode, process, or otherwise operate upon a memory address so that the respective memory cells can be accessed for reading and writing. The implementation of first and second stage row decode circuits 20 and 22 is readily understood by those of ordinary skill in the art.

In operation, the ADDR signal (conveying the addresses for rows of memory cells) is buffered and inverted by buffer 12 when a low value on the $\overline{\text{PROW}}$ signal is output by timing generator circuit 14. First latch circuit 16 passes and latches a first memory address when a pulse appears in the $\Phi1$ signal, which coincides with the simultaneous occurrence of a predetermined value for the RAS (or $\overline{\text{RAS}}$) signal and a predetermined value for the $\overline{\text{OE}}$ signal. In one embodiment, this may occur when the value of the RAS signal is low (and the $\overline{\text{RAS}}$ signal is high) and the value of the $\overline{\text{OE}}$ signal is low. While the first memory address is latched in first latch circuit 16, a pulse may appear in the $\Phi2$ signal. This pulse causes the first memory address to be passed and latched by second latch circuit 18, where the such address can be decoded by first and second stage row decode circuits 20 and 22. At this point, even as the first memory address is being decoded, first latch circuit 16 can receive a second memory address conveyed in the ADDR signal. Because circuit 10 can receive the next memory address before the first address is completely decoded, the operation of any memory device into which circuit 10 is incorporated is improved or enhanced.

Figure 2:
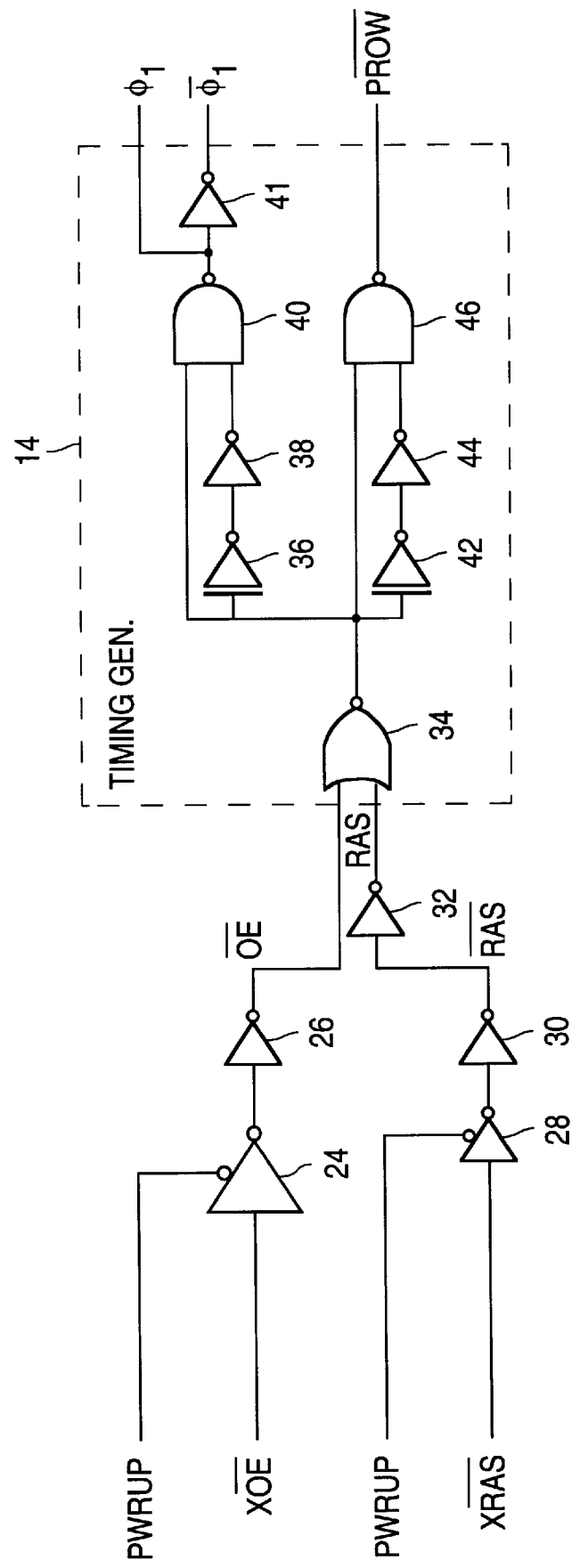
FIG. 2 is an exemplary schematic diagram for the timing generator circuit shown in FIG. 1, in accordance with an embodiment of the present invention.

FIG. 2 is an exemplary schematic diagram for the timing generator circuit 14 shown in FIG. 1, in accordance with an embodiment of the present invention. FIG. 2 also illustrates circuitry for generating the $\overline{\text{OE}}$ and RAS (and $\overline{\text{RAS}}$) signals.

The $\overline{\text{OE}}$ signal is generated by a buffer 24 coupled in series to an inverter 26. Buffer 24 receives an external output enable ($\overline{\text{XOE}}$) signal at its input lead and is enabled by a power up (PWRUP) signal. Inverter 26 receives and inverts the output signal of buffer 24 to produce the $\overline{\text{OE}}$ signal. The RAS signal is generated by series-connected inverters 28, 30, and 32. Inverter 28 is enabled by a power-up (PWRUP) signal and receives an external row address strobe ($\overline{\text{XRAS}}$) signal at its input lead. The output signal of inverter 28 is received and inverted by inverter 30 to produce a row address strobe complement $\overline{\text{RAS}}$ signal. The $\overline{\text{RAS}}$ signal is inverted by inverter 32 to generate the RAS signal.

Timing generator circuit 14 comprises circuitry for producing the $\Phi1$ signal, the $\overline{\Phi1}$ signal, and the $\overline{\text{PROW}}$ signal. As shown, timing generator circuit 14 includes a NOR gate 34 which receives the $\overline{\text{OE}}$ and RAS signals at its input leads. A delay element 36 and an inverter 38 are connected in series to the output lead of NOR gate 34. A NAND gate 40 has input leads connected to the output leads of NOR gate 34 and inverter 38. NAND gate 40 outputs the $\Phi1$ signal. An inverter 40 receives the output signal of NAND gate 40 and outputs the $\overline{\Phi1}$ signal. The operation of delay element 36 and inverter 38 to delay the signal from NOR gate 34 at one input of NAND gate 40 while the same signal is immediately fed into the other input of NAND gate 40 causes each of the $\Phi1$ and $\overline{\Phi1}$ signals to be a pulse signal. A delay element 42 and an inverter 44 are also coupled in series to the output lead of NOR gate 34. A NAND gate 46 receives the output signal of NOR gate 34 and the output signal of inverter 44 and, in response, generates the $\overline{\text{PROW}}$ signal, which also can be a pulse signal. The $\overline{\text{PROW}}$ signal should be active long enough for a valid memory address to feed through the first latch circuit 16. Accordingly, a pulse in the $\overline{\text{PROW}}$ signal should be greater in duration than a corresponding pulse in the $\Phi1$ signal.

Figure 3:
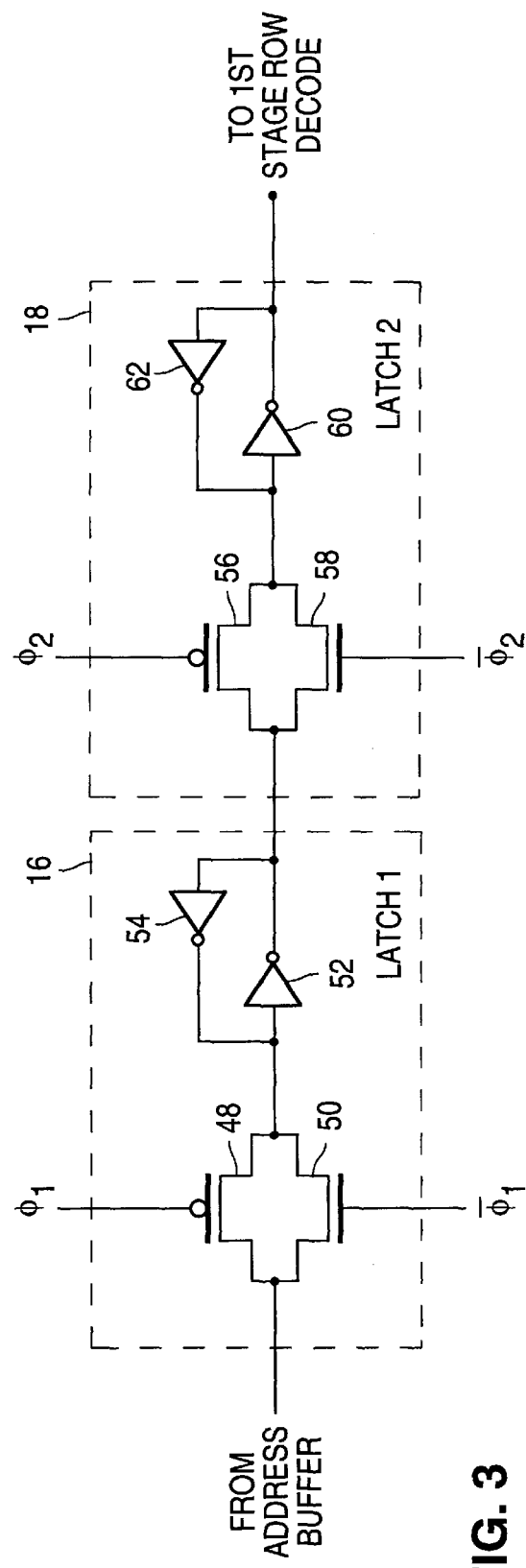
FIG. 3 is an exemplary schematic diagram for the first latch circuit and the second latch circuit shown in FIG. 1, in accordance with an embodiment of the present invention.

FIG. 3 is an exemplary schematic diagram for first latch circuit 16 and second latch circuit 18 shown in FIG. 1, in accordance with an embodiment of the present invention. As shown, first latch circuit 16 comprises a p-type transistor 48 and an n-type transistor 50 coupled together at their sources and drains. The gate of transistor 48 receives the $\Phi1$ signal and the gate of transistor 50 receives the $\overline{\Phi1}$ signal. In this arrangement, transistors 48 and 50 function as a passgate (implemented in CMOS) which passes a buffered row address signal when the $\Phi1$ signal goes low (and the $\overline{\Phi1}$ signal goes high). The input lead for an inverter 52 is coupled to the output lead of the passgate formed by transistor 48 and 50. An inverter 54 is coupled at its input lead to the output lead of inverter 52, and at its output lead to the input lead of inverter 52. As such, inverters 52 and 54 function as a latch to hold a memory address.

Second latch circuit 18 comprises a p-type transistor 56, an n-type transistor 58, an inverter 60, and an inverter 62 coupled in substantially the same arrangement as transistor 48, transistor 50, inverter 52, and inverter 54 of first latch circuit 16. Moreover, these elements of second latch circuit 18 perform substantially the same functions (i.e., operate in substantially the same manner) as the comparable elements in first latch circuit 16. Specifically, transistors 56 and 58 operate as a passgate, which is triggered by a timing signal (in this case, the Φ2 signal). Inverters 60 and 62 operate as a latch to retain a memory address.

In operation, upon the occurrence of a pulse in the Φ1 signal, the passgate formed by transistors 48 and 50 of first latch circuit 16 allows a first memory address to be latched by inverters 52 and 54. Upon the occurrence of a pulse in the Φ2 signal, the passgate formed by transistor 56 and 58 in second latch circuit 18 passes the first memory address to inverters 60 and 62. Inverters 60 and 62 maintain this first memory address so that it may be operated upon or decoded. As soon as the first memory address is latched into second latch circuit 18, first latch circuit 16 is available to receive a second memory address.

Figure 4:
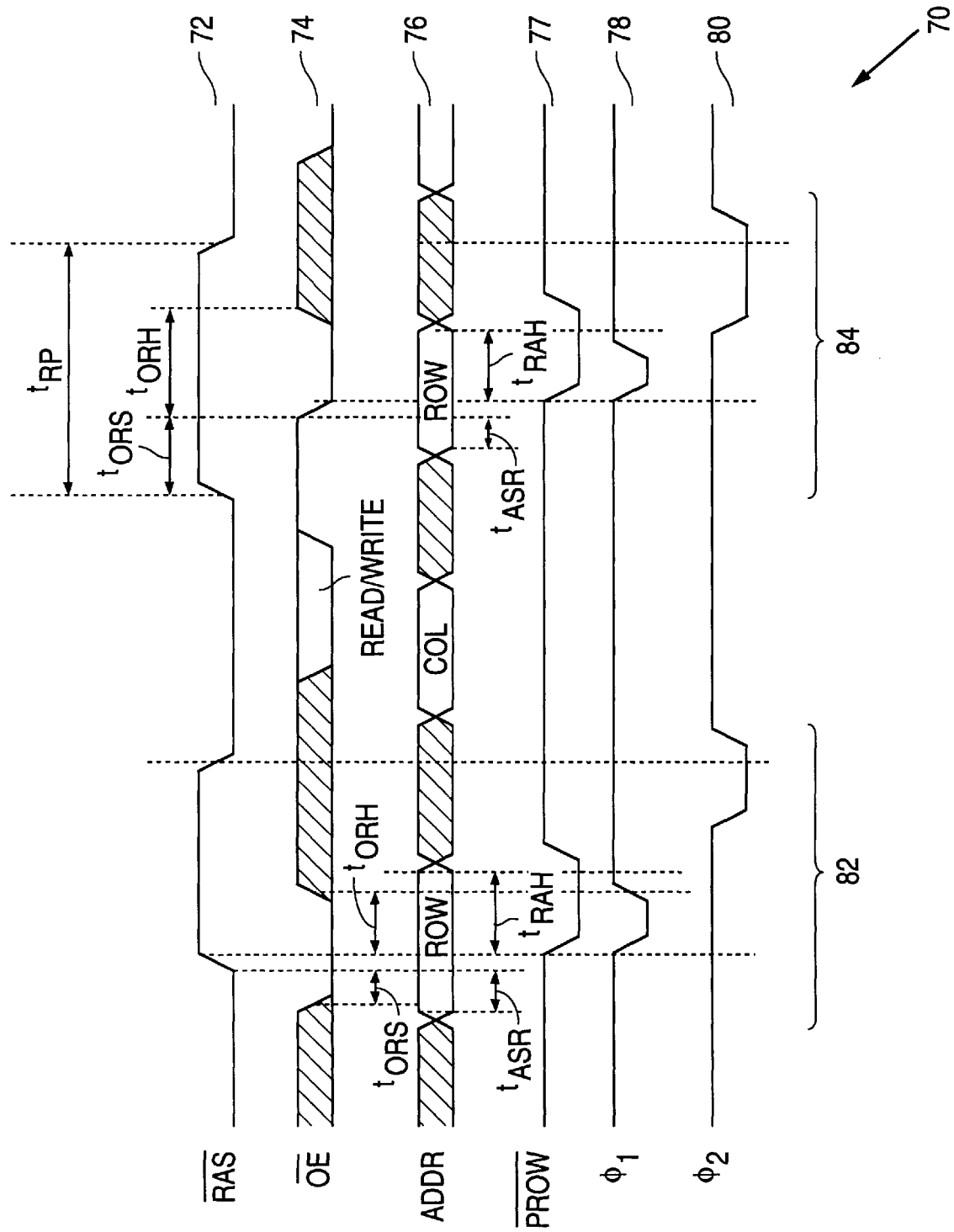
FIG. 4 is an exemplary timing diagram for a memory device wherein the set up of a memory address is controlled in accordance with an embodiment of the present invention.

FIG. 4 is an exemplary timing diagram 70 for a memory device wherein the setup of a memory address is controlled in accordance with an embodiment of the present invention.

Timing diagram 70 includes a plurality of exemplary waveforms that may be input or generated for various signals appearing in the circuitry described above with reference to FIGS. 1–3. Specifically, a row address strobe complement ($\overline{RAS}$) signal 72 can be output by inverter 30 of FIG. 2. An output enable ($\overline{OE}$) signal 74 can be output by inverter 26 of FIG. 2. An address (ADDR) signal 76 can be input into buffer 12 of FIG. 1. A $\overline{PROW}$ signal 77 and a Φ1 timing signal 78 can be output by timing generator circuit 14 of FIGS. 1 and 2. A Φ2 timing signal 80 can be input into second latch circuit 18 of FIGS. 1 and 3.

ADDR signal 76 conveys information for a number of memory addresses which are represented by frames labeled "ROW" or "COLUMN" in signal 76. The set up of these memory addresses is controlled by $\overline{RAS}$ signal 72 and $\overline{OE}$ signal 74. That is, when a predetermined value for $\overline{RAS}$ signal 72 and a predetermined value for $\overline{OE}$ signal 74 simultaneously occur, a memory address is latched into first latch circuit 16 (FIG. 1). In one embodiment, as depicted, this may occur when the value of $\overline{RAS}$ signal 72 is high and the value of $\overline{OE}$ signal 74 is low.

For example, in one period 82, a first row address is set up when the value of $\overline{OE}$ signal 74 is low as the value of $\overline{RAS}$ signal 72 transitions high. The difference in time between the moment that $\overline{OE}$ signal 74 goes low and the moment that $\overline{RAS}$ signal 72 goes high constitutes the $\overline{OE}$ to $\overline{RAS}$ setup time ($t_{ORS}$). The difference in time between the moment that $\overline{RAS}$ signal 72 goes high and the moment that $\overline{OE}$ signal 74 goes high again constitutes the $\overline{OE}$ to $\overline{RAS}$ hold time ($t_{ORH}$) The difference in time between the beginning of the first row address and the moment that $\overline{RAS}$ signal 72 goes high constitutes the row address setup time ($t_{ASR}$). The difference in time between the moment that $\overline{RAS}$ signal 72 goes high and the end of the first row address constitutes the row address hold time ($t_{RAH}$).

During exemplary period 82, the transition of $\overline{RAS}$ signal 72 from low to high while $\overline{OE}$ signal 74 is low causes a pulse in Φ1 signal 78. During this pulse, Φ1 signal 78 is low.

Accordingly, the passgate comprising transistors 48 and 50 of first latch circuit 16 (FIG. 3) passes the first row address into the latch formed by inverters 52 and 54 (also FIG. 3). At the end of the pulse, Φ1 signal 78 goes high and the first row address is latched into the latch of inverters 52 and 54. While the first row address is held in first latch circuit 16, Φ2 signal 80 goes low, thereby causing the passgate comprising transistors 56 and 58 of second latch circuit 18 (FIG. 3) to pass the first row address into the latch formed by inverters 60 and 62 (also FIG. 3). At this point, the first row address is available for decoding by first and second stage row decoders 20 and 22 (FIG. 1). When Φ2 signal 80 goes high, the first row address is latched into second latch circuit 18 so that such address may continue to be decoded. First latch circuit 16 is now available to receive a second row address.

In another exemplary period 84, a second row address is set up when the value of $\overline{RAS}$ signal 72 is high as the value of $\overline{OE}$ signal 74 transitions low. In this instance, $t_{ORS}$ is the difference in time between the moment that $\overline{RAS}$ signal 72 goes high and the moment that $\overline{OE}$ signal 74 goes low. $t_{ORH}$ is the difference in time between the moment that $\overline{OE}$ signal 74 goes low and the moment that $\overline{OE}$ signal 74 goes high again. The time during which $\overline{RAS}$ signal 72 is high constitutes the RAS pre-charge time ($t_{RP}$). $t_{ASR}$ is the difference in time between the beginning of the second row address and the moment that $\overline{OE}$ signal 74 goes low. $t_{RAH}$ is the difference in time between the moment that $\overline{OE}$ signal 74 goes low and the end of the second row address.

During period 84, at least initially, the first row address may still be decoded even as the second row address is being set up. The transition of $\overline{OE}$ signal 74 from high to low while $\overline{RAS}$ signal 72 is high causes a pulse in Φ1 signal 78. During such pulse, the value of Φ1 signal 78 is low so that the passgate of first latch circuit 16 passes the second row address into the latch of the same circuit. At the end of the pulse, Φ1 signal 78 goes high and the second row address is latched into the latch of inverters 52 and 54. While the second row address is held in first latch circuit 16, Φ2 signal 80 goes low, which causes the passgate of second latch circuit 18 to pass the second row address into the latch formed by inverters 60 and 62.

Although the present invention and it s advantages have been described in detail, it should be understood that various changes, substitutions, and alterations can be made therein without departing from the spirit and scope of the invention as defined by the appended claims.

What is claimed is:

1. A circuit for controlling the set up of a memory address, comprising:

a first latch circuit for latching a first memory address in response to a first simultaneous occurrence of a predetermined value for an output enable signal and a predetermined value for a row address strobe signal;

a second latch circuit coupled to the first latch circuit, the second latch circuit for receiving the first memory address from the first latch circuit and latching the first memory address thereafter for decoding; and wherein the first latch circuit latches a second memory address in response to a second simultaneous occurrence of the predetermined value for the output enable signal and the predetermined value for the row address strobe signal, the second simultaneous occurrence occurring while the first memory address is being decoded.

2. The circuit of claim 1, wherein each of the first latch circuit and the second latch circuit comprises:

a passgate responsive to the simultaneous occurrence of the predetermined value for the output enable signal and the predetermined value for the row address strobe signal; and a latch coupled to the passgate.

3. The circuit of claim 2, wherein each passgate comprises:

a p-type transistor for receiving a respective timing signal; and an n-type transistor coupled with the p-type transistor, the n-type transistor for receiving a complement of the respective timing signal.

4. The circuit of claim 2, wherein each latch comprises:

a first inverter having an input lead coupled to an output lead of the respective passgate; and a second inverter having an input lead coupled to an output lead of the first inverter, the second inverter having an output lead coupled to the input lead of the first inverter.

5. The circuit of claim 1, further comprising a buffer coupled to the first latch circuit, the buffer for buffering an address signal conveying the first memory address and the second memory address.

6. The circuit of claim 1, further comprising a timing generator circuit for generating at least one timing signal in response to the output enable signal and the row address strobe signal.

7. The circuit of claim 1, further comprising at least one row decode circuit coupled to the second latch circuit, the row decode circuit for decoding the first and second memory addresses.

8. A method for controlling the set up of a memory address, the method comprising:

latching a first memory address in response to a first simultaneous occurrence of a predetermined value for an output enable signal and a predetermined value for a row address strobe signal;

decoding the first memory address for access to at least one memory cell corresponding to the first memory address; and while the first memory address is being decoded, latching a second memory address in response to a second simultaneous occurrence of the predetermined value for the output enable signal and the predetermined value for the row address strobe signal.

9. The method of claim 8, further comprising generating at least one timing signal in response to the output enable signal and the row address strobe signal.

10. The method of claim 8, further comprising buffering an address signal which conveys the first memory address and the second memory address.

* * * * *